(12) United States Patent
Baba

(10) Patent No.: US 6,609,240 B2
(45) Date of Patent: Aug. 19, 2003

(54) METHOD OF DESIGNING CONDUCTIVE PATTERN LAYOUT OF LSI

(75) Inventor: Toshiaki Baba, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 85 days.

(21) Appl. No.: 09/984,839

(22) Filed: Oct. 31, 2001

(65) Prior Publication Data

US 2003/0084417 A1 May 1, 2003

(51) Int. Cl.[7] .............................................. G06F 17/50
(52) U.S. Cl. .............................. 716/10; 716/11; 716/12
(58) Field of Search ................................ 716/7–18, 1–6

(56) References Cited

U.S. PATENT DOCUMENTS

| | | | | |
|---|---|---|---|---|
| 5,856,927 A | * | 1/1999 | Greidinger et al. | ........... 716/12 |
| 5,917,729 A | * | 6/1999 | Naganuma et al. | ........... 716/10 |
| 6,035,111 A | * | 3/2000 | Suzuki et al. | ........... 716/11 |
| 6,223,329 B1 | * | 4/2001 | Ling et al. | ........... 716/7 |
| 6,446,245 B1 | * | 9/2002 | Xing et al. | ........... 716/10 |
| 6,467,074 B1 | * | 10/2002 | Katsioulas et al. | ........... 716/17 |

\* cited by examiner

*Primary Examiner*—Vuthe Siek
*Assistant Examiner*—Paul Dinh
(74) *Attorney, Agent, or Firm*—Rabin & Berdo, PC

(57) ABSTRACT

There is provided a method of designing a conductive pattern layout between a plurality of blocks in an LSI, the conductive pattern transferring data from one block to the other blocks, comprising: (a) extracting the blocks from logic circuit data; (b) preparing a floor plan which defines a provisional arrangement of the blocks; (c) arranging a plurality of conductive pattern cells between the plurality of blocks after preparing the floor plan; (d) re-arranging the blocks on the basis of the arrangement of the conductive pattern cells; (e) arranging a plurality of power source patterns; and (g) arranging a plurality of signal patterns. Due to this conductive pattern layout and method of designing thereof, wiring between blocks can be carried out simply and with high accuracy.

13 Claims, 8 Drawing Sheets

F I G. 1
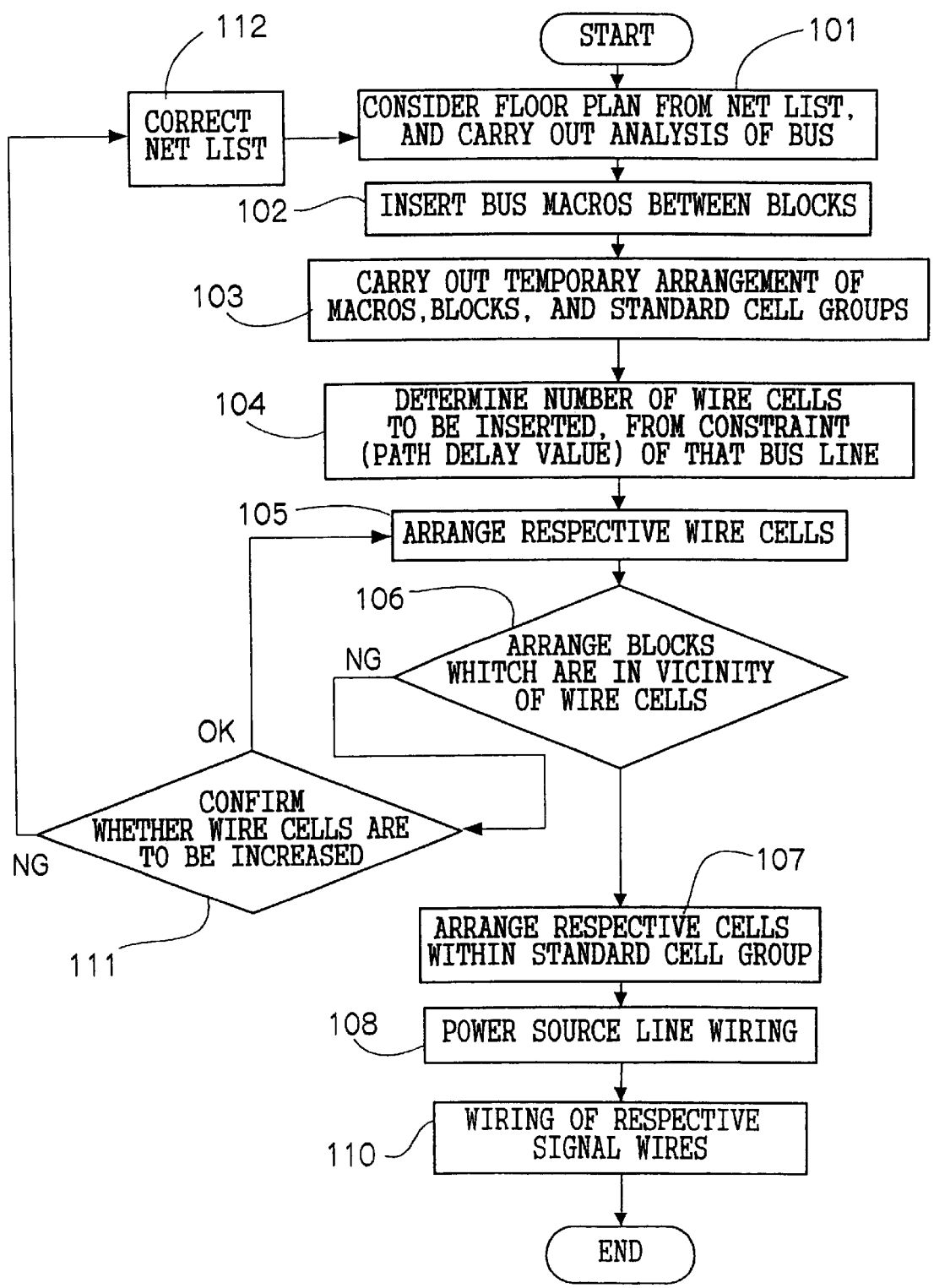

F I G. 4
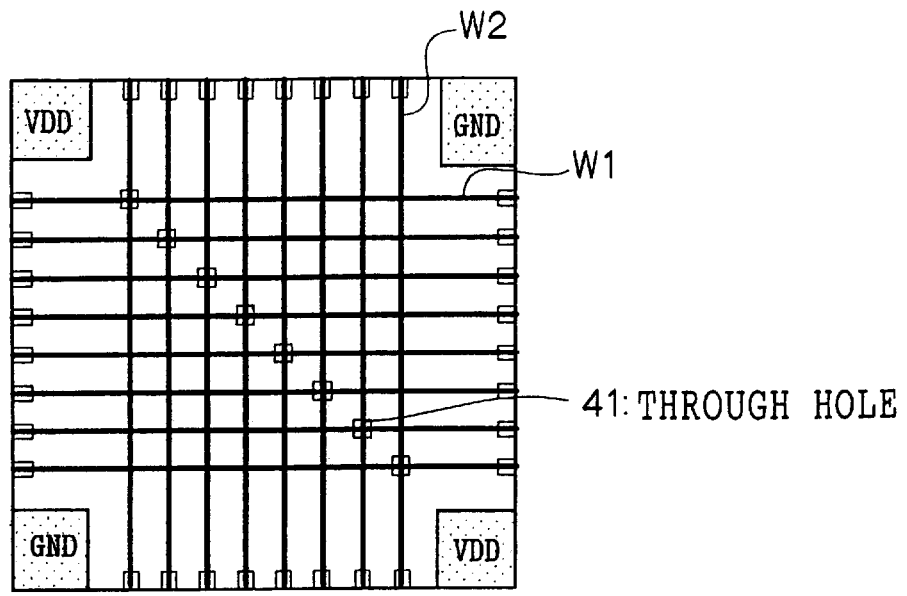
F I G. 5
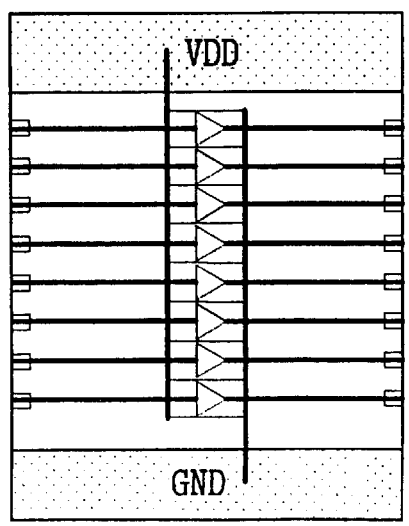

F I G. 6
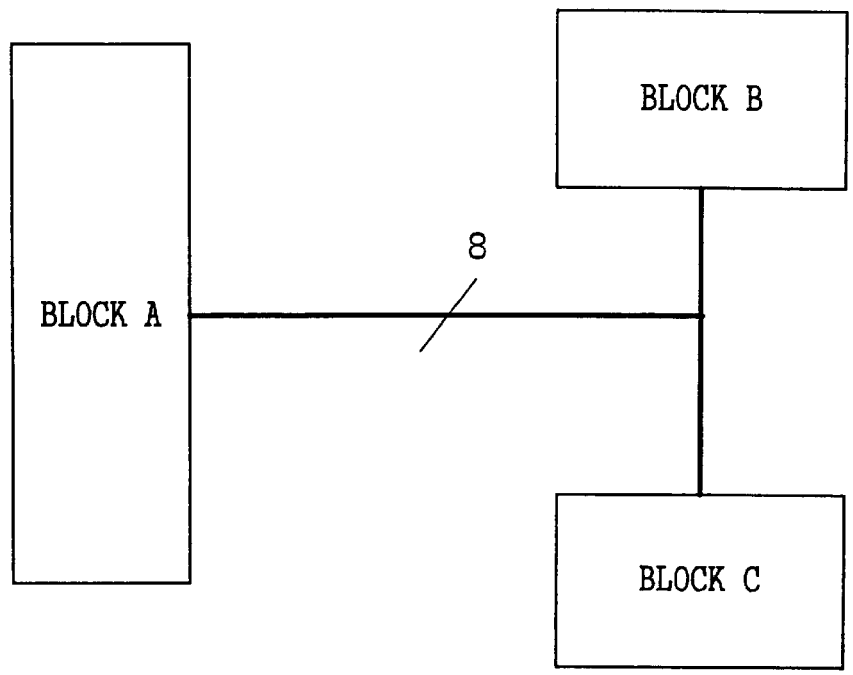
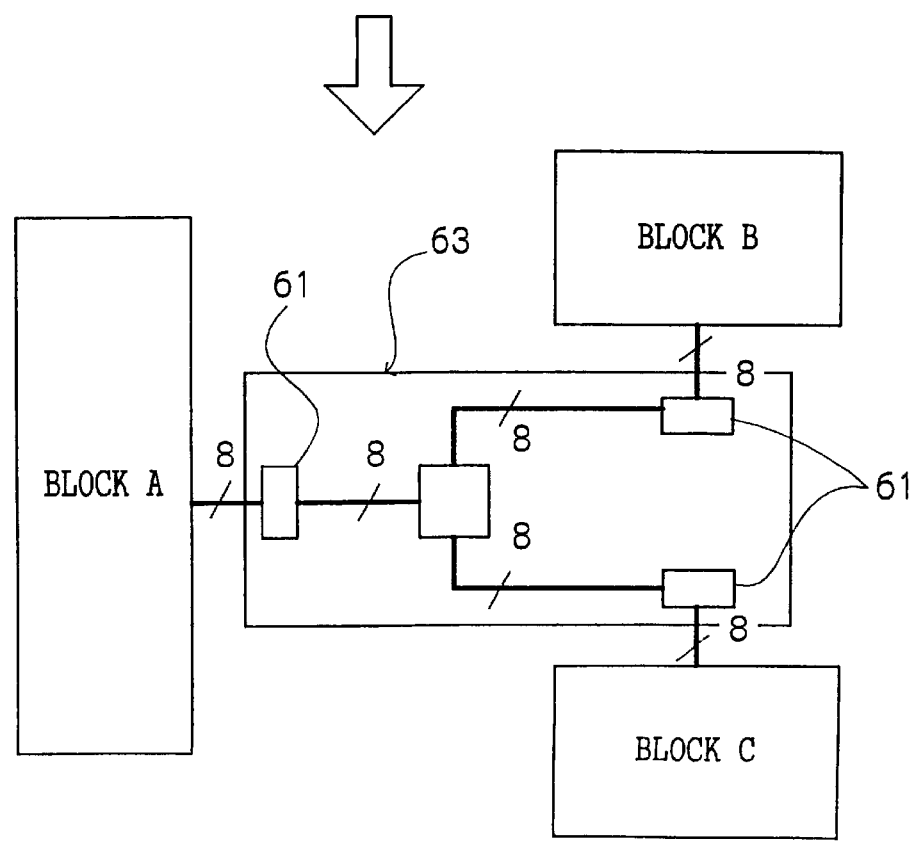

F I G. 9
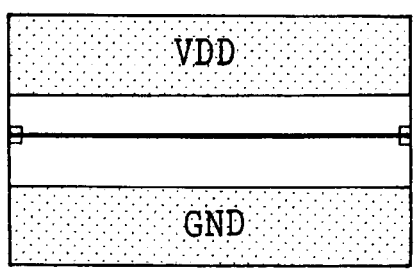
WIRE PORTION CELL
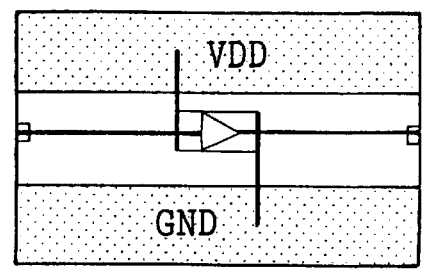
REPEATER INSERTION CELL
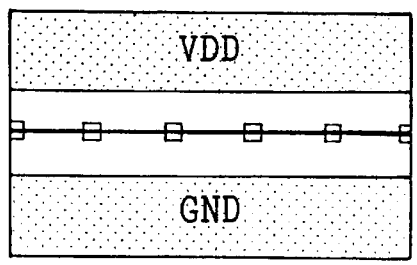
BLOCK CONNECTING PORTION CELL
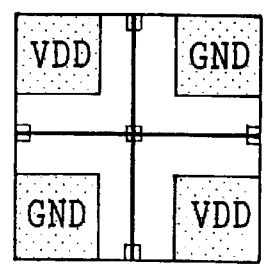
SWITCH BOX CELL

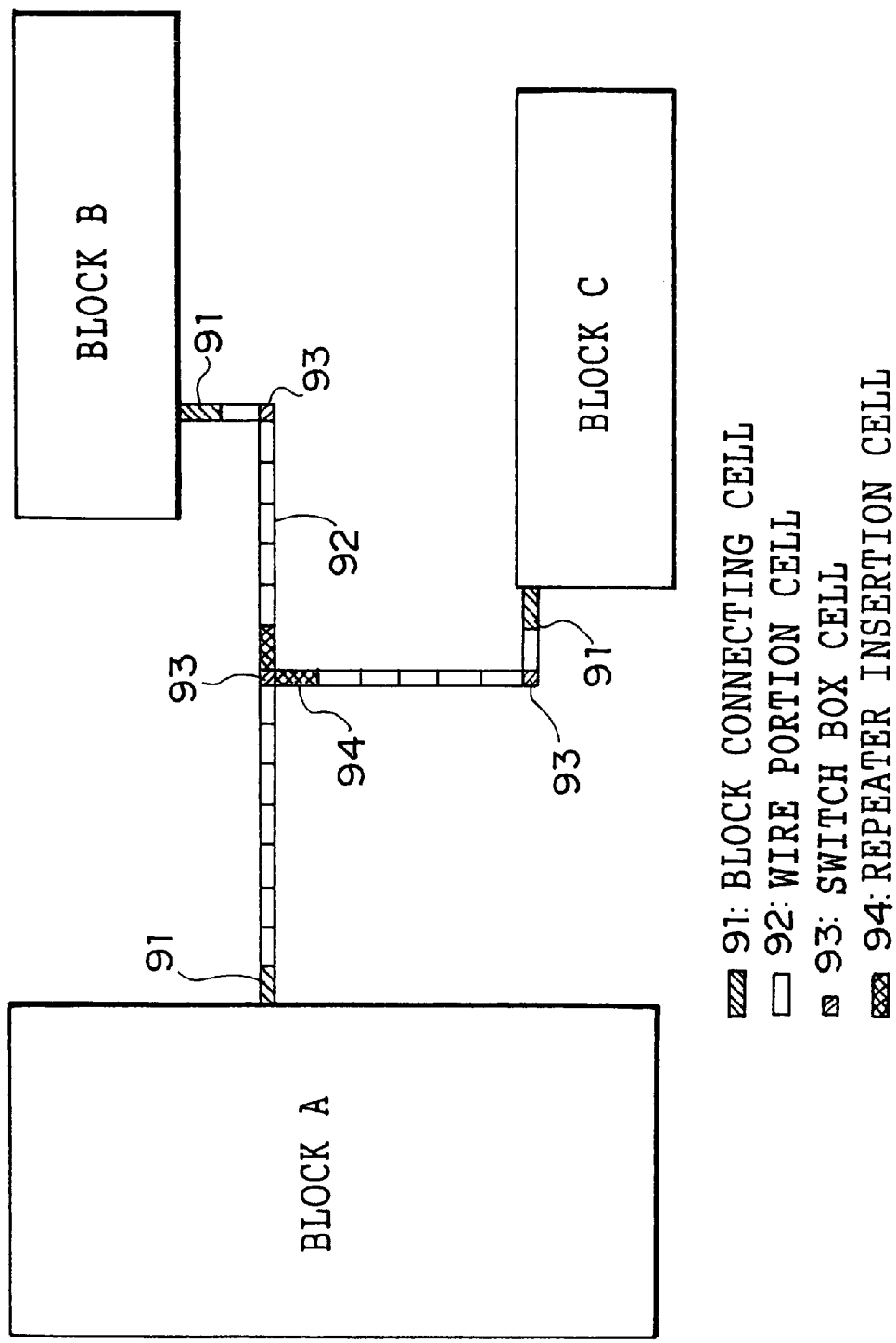

METHOD OF DESIGNING CONDUCTIVE PATTERN LAYOUT OF LSI

BACKGROUND OF THE INVENTION

The present invention relates to a layout method of a wiring pattern in LSI circuit layout design. In particular, the present invention relates to a layout method which realizes, with short paths, a layout (arrangement) of wiring patterns for connection of elements between which there is a relatively long distance on the LSI, without relying on wires extending over a wide range on the LSI (wires which go around a wide range), and accordingly, without relying on wires of a long path length (connecting path length between elements).

In conventional LSI circuit layout design, logic circuit data is inserted in software exclusively used for layouts, and a macro cell circuit pattern (corresponding to a RAM, an IP or the like) or a "part" pattern such as a standard cell circuit pattern or the like is obtained as the output. (Hereinafter, these patterns will be called macro cells and standard cells, respectively.) Then, first, these cells are arranged.

Next, a power source wiring pattern is arranged. Thereafter, among the wiring patterns (which will be called "wires" hereinafter for the sake of simplicity), a clock wiring pattern (which will be called "clock wire" hereinafter for the sake of simplicity), which is a wiring pattern having high priority (high wire priority), is arranged.

At the wires having a lower priority than the clock wire, after the clock wire has been arranged, the contact points (starting point and ending point) and the general wiring path of wires extending over a wide range on the LSI (which are accordingly wires of a long path length) are specified, and the wires extending over a wide range on the LSI are arranged at the same time as the short wires or the wires of average lengths.

In the above-described LSI circuit pattern layout method, blocks of a circuit pattern, such as hard macro cells, for example, the RAM, the ROM and standard cells, are already arranged in the initial stages. Thus, the wires which extend over a wide range of the LSI are disposed so as to detour around these blocks. As a result, problems arise in that the wiring delay and slew rate (distortion) become large, and misoperation at the time of operation of the LSI arises, or it is easy to be affected by noise from other signals. These problems also become a cause of a decrease in the yield during the LSI manufacturing process.

At the wires which extend over a wide range on the LSI, there are many cases in which the wires which are connected to the same macro cell or to the same type of standard cells are disposed such that the logical connection relationships with other circuit patterns (hereinafter simply called "connection relationships") are such that the same wires are bundled together. At the time of LSI operation, these bundled wires logically propagate signals for the same operation, and thus, each of these wires must exhibit the same wire delay. However, in the conventional LSI wiring pattern layout method, the general wire paths are specified, and it is not always the case that each of the wires extending over a wide region on the LSI are disposed adjacent to one another. Thus, the signal propagation time of each wire differs. A signal, which must reach the connection destinations of the respective wires at the same time, reaches the connection destinations at different times, which is a cause for misoperation of the LSI. If such a problem arises, either the logic circuit data inputted to the software exclusively used for layout must be corrected, or the layout must be redesigned. As a result, a problem arises in that the development TAT of the LSI is long. In particular, in LSI technology of a generation in which the design rule is 0.25 microns or less, the effect of correcting the data or redesigning the layout during the LSI development TAT is great.

Problems such as those described above rarely occur with wires which connect interior cells of the same block. This is because the wire path length usually is short. However, with wires which extend over a wide range on the LSI, such as wires which connect a block to another block, it should be kept in mind that the problems described above are marked.

SUMMARY OF THE INVENTION

In order to overcome the above-described problems, a wiring layout between blocks in an LSI which is a first aspect of the present invention comprises: a plurality of connecting portion cells having a same internal wiring pattern, each of the plurality of connecting portion cells being disposed adjacent to one of the blocks; a plurality of wire portions having first and second end portions, a first end portion of each of the wire portions being disposed adjacent to one of the plurality of connecting portion cells; and at least one switch box cell, and second end portions of at least two wire portions which are disposed continuously from any block of the blocks, are adjacent to each of the switch box cells.

Here, each of the plurality of wire portions is formed from a plurality of wire portion cells having a same internal wiring pattern, and among the plurality of wire portion cells, one wire portion cell which is positioned at the first end portion of the wire portion is disposed adjacent to one of the plurality of connecting portion cells, and other wire portion cells are continuous with a wire portion cell adjacent to the connecting portion cell and are arranged in a direction of moving away from the connecting portion cell.

Further, each of the plurality of connecting portion cells includes wiring patterns, which are formed from a first or a second wiring layer and which are of a number which is equal to a number of wiring bits, and a plurality of first contact hole patterns which are for electrical connection with adjacent blocks; each of the plurality of wire portion cells includes wiring patterns which are formed from a first or a second wiring layer and are of a number which is equal to the number of wiring bits; and the wiring patterns, which are included in the plurality of wire portion cells which form at least one wire portion among at least two wire portions which are adjacent to the at least one switch box cell, are formed from the first wiring layers, and all of the wiring patterns, which are included in the plurality of wire portion cells which form other wire portions, are formed from the second wiring layers, and the switch box cell includes first wiring patterns, which intersect one another and are of a number equal to a number of wiring bits formed from the first wiring layers, and second wiring patterns of a number equal to a number of wiring bits formed from the second wiring layers, and second contact hole patterns of a number equal to the number of wiring bits, which second contact hole patterns are for electrically connecting the second wiring patterns and the first wiring patterns corresponding to respective bits.

Due to the above-described layout structure, the wires corresponding to the respective bits are arranged in a state of all being bundled together, and the problem of skewing between bits does not arise.

Further, a method of designing a wiring layout between blocks in an LSI of a second aspect of the present invention comprises the steps of: (a) extracting, from logic circuit data, blocks, macro cells, and logic blocks which are to become standard cell groups (which are sets of standard cells); (b) preparing a floor plan by analyzing bus lines connecting respective logic blocks which are extracted; (c) between blocks, preparing macros for wiring which are formed from connecting portion cells, which connect the respective blocks and wires, and switch box cells, which change directions and layers of the wires, and inserting the macros for wiring into a net list; (d) temporarily arranging the macro cells, the blocks and the standard cell groups; (e) determining an arrangement of wire portion cells which define wires of regions other than the connecting portion cells and the switch box cells, wherein a number of wire portion cells which are arranged is determined by the following formulas from an allowable value of a path delay value of the wires:

(number of wire portion cells)=(path delay value of wires)/(wire delay of 1 wire portion cell)　　　(formula 1)

(wire delay of 1 wire portion cell)=(wire resistance)*(wire capacity)　　　(formula 2)

(f) arranging block connecting portion cells adjacent to the respective macro cells; (g) arranging the wire portion cells continuously such that a wire path is a shortest distance, wherein in a case in which a change in a wire direction is required, the switch box cells are arranged and a direction of the wires is changed; (h) computing an overall wire length, and judging whether a path delay value of the wires falls within a range of allowable values; (i) when the overall wire length is too long and results of determination in (h) are affirmative, changing an arrangement of the wire portion cells; (j) repeating steps (g) through (i) until the path delay of the wires falls within the range of allowable values; (k) changing arrangement positions of the macro cells, the blocks, and the standard cell groups which were temporarily arranged, so as to suit a wiring layout; (l) at an interior of each standard cell group, determining an arrangement of cells within the group so as to reshape the overall shape of the group and reduce empty regions; (m) carrying out power source wiring; (n) carrying out clock tree synthesis; and (o) arranging signal wires.

Due to the above-described method of designing a layout, because the path delay of the bus line is considered from the initial stages of designing, highly accurate designing is possible.

Further, a third aspect of the present invention is a method of designing a conductive pattern layout between a plurality of blocks in an LSI, the conductive pattern transferring data from one block to the other blocks, comprising: (a) extracting the blocks from logic circuit data; (b) preparing a floor plan which defines a provisional arrangement of the blocks; (c) arranging a plurality of conductive pattern cells between the plurality of blocks after preparing the floor plan; (d) re-arranging the blocks on the basis of the arrangement of the conductive pattern cells; (e) arranging a plurality of power source patterns; and (g) arranging a plurality of signal patterns.

BRIEF DESCRIPTION OF THE DRAWINGS

FIG. 1 is a flowchart showing a method of designing an LSI layout of the present invention.

FIG. 4 is a diagram showing a repeater insertion cell which is a cell exclusively used for wiring in the first embodiment of the present invention.

FIG. 5 is a diagram showing a block connecting portion cell which is a cell exclusively used for wiring in the first embodiment of the present invention.

FIG. 6 is a diagram showing an image of data which is inputted to software exclusively used for layout, in the first embodiment of the present invention.

FIG. 9 is a diagram showing unit cells for 1 bit of cells exclusively used for wiring, in a third embodiment of the present invention.

FIG. 10 is a diagram showing a layout image for clock wires in the third embodiment of the present invention.

DETAILED DESCRIPTION OF THE PREFERRED EMBODIMENTS

Hereinafter, embodiments of the present invention will be described in detail with reference to the figures.
(First Embodiment)

FIG. 1 is a diagram showing an LSI layout designing flowchart of the present invention.

First, a floor plan, which is for determining a provisional arrangement of blocks comprised of hard macro cells, such as the RAM and the ROM, or cell groups of standard cells is prepared (S101).

Next, (plural) cells exclusively used for wiring, which are proposed by the present invention, are arranged (S105).

Thereafter, on the basis of the arrangement of the cells exclusively used for wiring, the macros and the standard cell groups which were provisionally arranged are re-arranged (the arrangement is corrected)(S106).

Then, the respective standard cells within the standard cell groups are arranged (S107).

Next, the power source wires are arranged (S108). Then, the signal wires are arranged (S110).

Examples of the cells exclusively used for wiring are as follows. FIGS. 2, 3, 4 and 5 illustrate a wire portion cell, a block connecting portion cell, a switch box cell, and a repeater insertion cell, which are four types of cells exclusively used for wiring which are proposed by the present invention. Note that, in the present embodiment, a wiring layout of a bus line for 8 bits is supposed, and thus, eight independent wires are included in each cell in correspondence with the respective bits.

Figure 2:
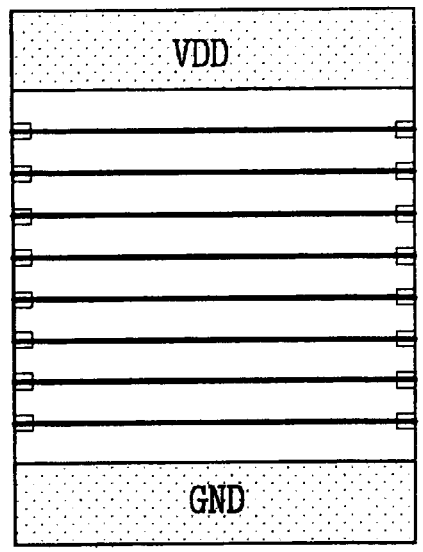
FIG. 2 is a diagram showing a wire portion cell which is a cell exclusively used for wiring in a first embodiment of the present invention.

The wire portion cell of FIG. 2 is a cell which is connected to the block connecting portion cell, the switch box cell, the repeater insertion cell or another wire portion cell. That is, the wire portion cell is not connected to the macro cells or the standard cells. And the wire portion cell is used in place of wires which extend over a wide range on the LSI. The layers (wire layers) forming the wires within the wire portion cells do not vary along the wire (the layers do not change).

Figure 3:
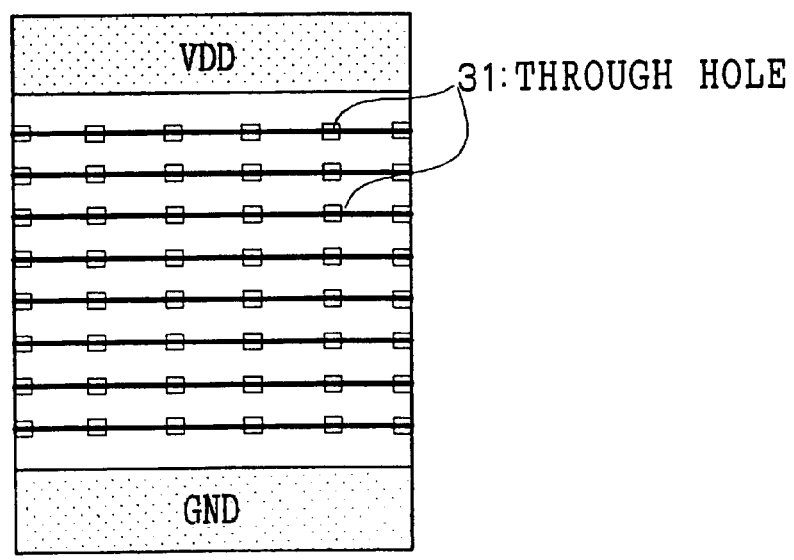
FIG. 3 is a diagram showing a switch box cell which is a cell exclusively used for wiring in the first embodiment of the present invention.

The block connecting portion cell of FIG. 3 is a cell which functions as an interface between the wire portion cells and the respective blocks. In the figure, TH1 is a through hole for connecting the wire of the wire portion cell and the wire which comes out from the macro cell or the standard cell. In some of these through holes, connections that achieve electrical connections between wire portion cell patterns and patterns of marco cells or standard cells are formed.

Accordingly, no short circuit occurs between adjacent wire portion cell patterns.

The switch box cell of FIG. 4 is a cell for changing the layer (wire layer) forming the wire which extends over a wide range on the LSI, or for changing the direction of the wire. In FIG. 4, (plural) wires W1 in the longitudinal direction and (plural) wires W2 in the transverse direction are wires which are formed by respectively different layers. Each of W1 and W2 is connected together via through holes TH2. As a result, within the switch box cell, the direction and layer of the wire W1 with respect to the wire W2 (or vice versa) is changed. Namely, W1 and W2 are "switched" with respect to one another.

The repeater insertion cell of FIG. 5 is a cell which works as a buffer for preventing wave rounding which is generated when the wire is long.

Hereinafter, the layout method using these cells which are exclusively used for wiring will be described in further detail.

First, a floor plan is prepared. At this time, logic blocks, which have been made into blocks or into standard cell groups from logic circuit data which is input data, are picked-up, and the bus line connected to each logic block which has been picked-up is analyzed. Then, as shown in FIG. 6, a bus line macro is formed between blocks, and is inserted into a net list. The bus line macro which is formed here is formed by two types of cells which are exclusively used for wiring, which are the above-described block connecting portion cells and the switch box cells. Then, the macro cells, the blocks, and the standard cell groups are temporarily arranged.

Next, the arrangement of the wire portion cells is determined. The number of wire portion cells which are arranged is determined by the following formulas from the bus line constraint (i.e., the path delay value).

(number of wire portion cells)=(path delay value of bus)/(wire delay of 1 wire portion cell)     (formula 1)

(wire delay of 1 wire portion cell)=(wire resistance)*(wire capacity)     (formula 2)

Wire portion cells of the number which is determined as described above are arranged, and the bus line layout of the LSI is completed by the layout tool.

Figure 7:
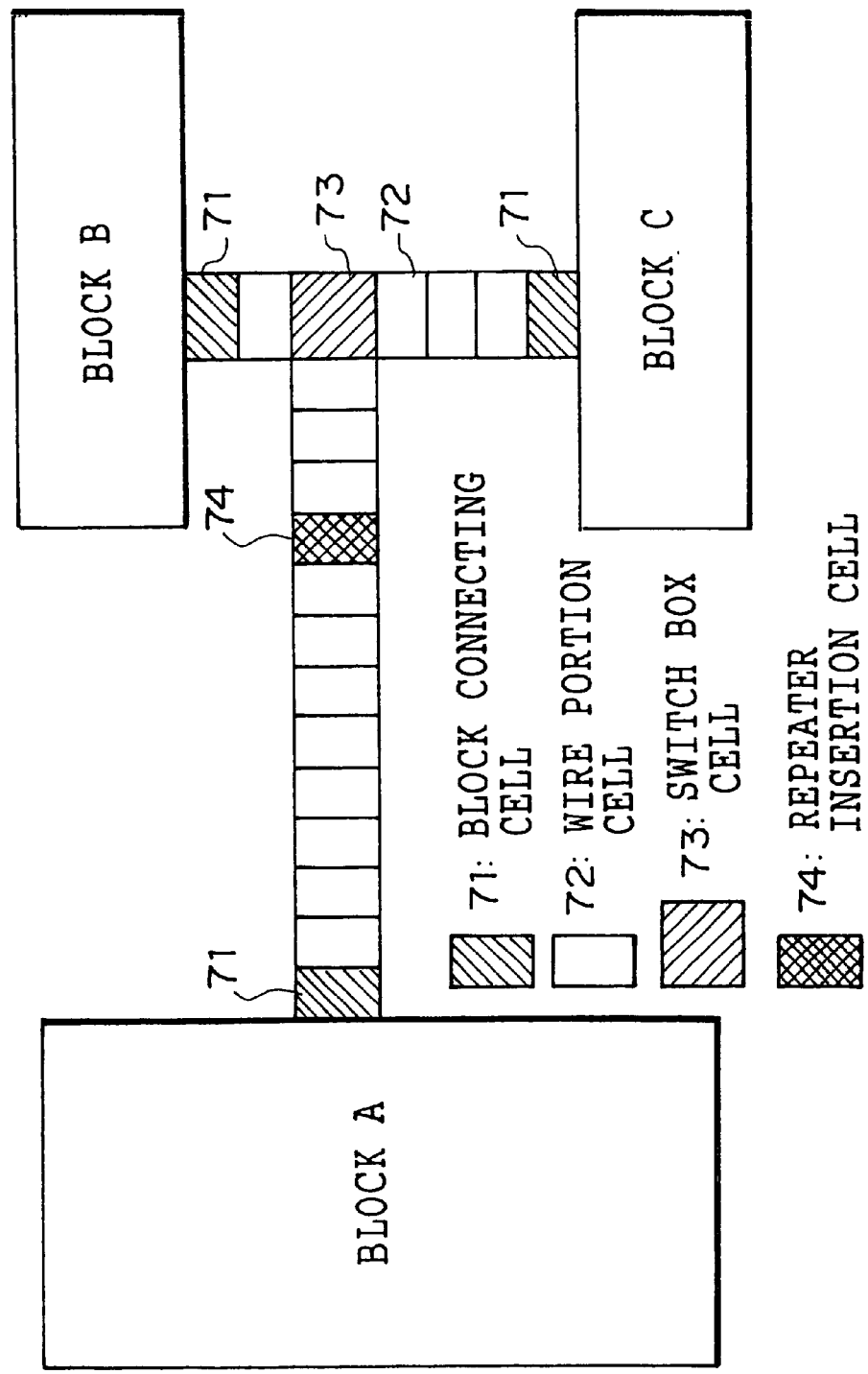
FIG. 7 is a diagram showing a layout image in the first embodiment of the present invention.

In the example of the net list shown in FIG. 6, as shown in FIG. 7, first, a block connecting portion cell 1 is disposed in the vicinity of each macro cell. Next, wire portion cells 2 are arranged continuously such that the final wire path is the shortest distance. At this time, if a change in the wire direction is needed, a switch box cell 3 is disposed, and the direction of the wire is changed.

Thereafter, the overall wire length is determined, and it is judged whether the bus line constraint is satisfied. In a case in which the overall wire length is too long, the arrangement of the wire portion cells is changed. Changing of the arrangement of the wire portion cells is continued until the bus line constraint is finally satisfied.

Next, in a case in which the bus line constraint is satisfied but the wire length is too long to suppress slew rate, at least one repeater insertion cell 4 is disposed, in place of the wire portion cell, so as to satisfy a maximum capacitance condition. This maximum capacitance is determined by wire capacity between blocks, and by input gate resistance of the buffer. At this time, the number of repeater insertion cells which are disposed in place of the wire portion cells is determined on the basis of the repeater insertion cell delay which is determined from the following formula.

(wire delay of repeater insertion cell)=(wire delay of wire portion cell)+(self-delay of buffer)+(additional delay per 1 pF)*(wire capacity)     (formula 3)

Thereafter, the arranged positions of the macro cells, the blocks, and the standard cell groups are changed so as to be optimal for the wiring layout. Moreover, within the standard cell group, work is carried out to reshape the overall shape of the group and reduce empty regions, or an arrangement of cells within the group is determined.

Next, power source wiring is carried out in consideration of the shapes of the macro cells, the blocks, and the standard cell groups.

Then, after matching a delay of clocks in the blocks, each of which comprises a plurality of cell groups, the signal wires are arranged.

In accordance with the layout designing method described above, the path delay of the bus line is known from the initial stages of layout design. Thus, highly accurate logic design which was not possible in conventional methods, such as designing of the data transfer speed between blocks and the like, is possible. Further, because the wire portion cells are used, the (plural) wires corresponding to the respective bits are laid-out in a state of all being bundled together. As a result, skewing between bits, which conventionally could only be known after the layout was completed, does not arise in theory, and thus, there is no need to consider skewing at the time of designing the layout. Accordingly, the quality of the data transfer between blocks is good, and there is no delay between bits generated at the data bus line or the address bus line. Therefore, a high speed bus line construction is possible. Moreover, by using the repeater insertion cells, a waveform which is always uniform can be obtained without slew rate arising, and therefore, the quality of the signal passing through the bus line is good.

Note that, in the present embodiment, the number of wire portion cells is determined from the path delay of the bus line. However, the number of wire portion cells may be determined from the number of connections, the wire capacity, or the wire resistance, which relate to the delay.

Further, the cells which are used exclusively for wiring are 8 bits. However, the bus line does not have to be connected to all of the terminals of the cells used exclusively for wiring.

Moreover, in the present embodiment, a case is shown in which repeater insertion cells are used to prevent waveform rounding. However, in this case, the transmission of data via the bus line is possible in only a single direction. Accordingly, in cases in which data transmission in both directions is desirable, it suffices either not to use the repeater insertion cells, or to, in place of the repeater insertion cells, use tri-state buffers which function as buffers in both directions and which are known in this art.

(Second Embodiment)

Figure 8:
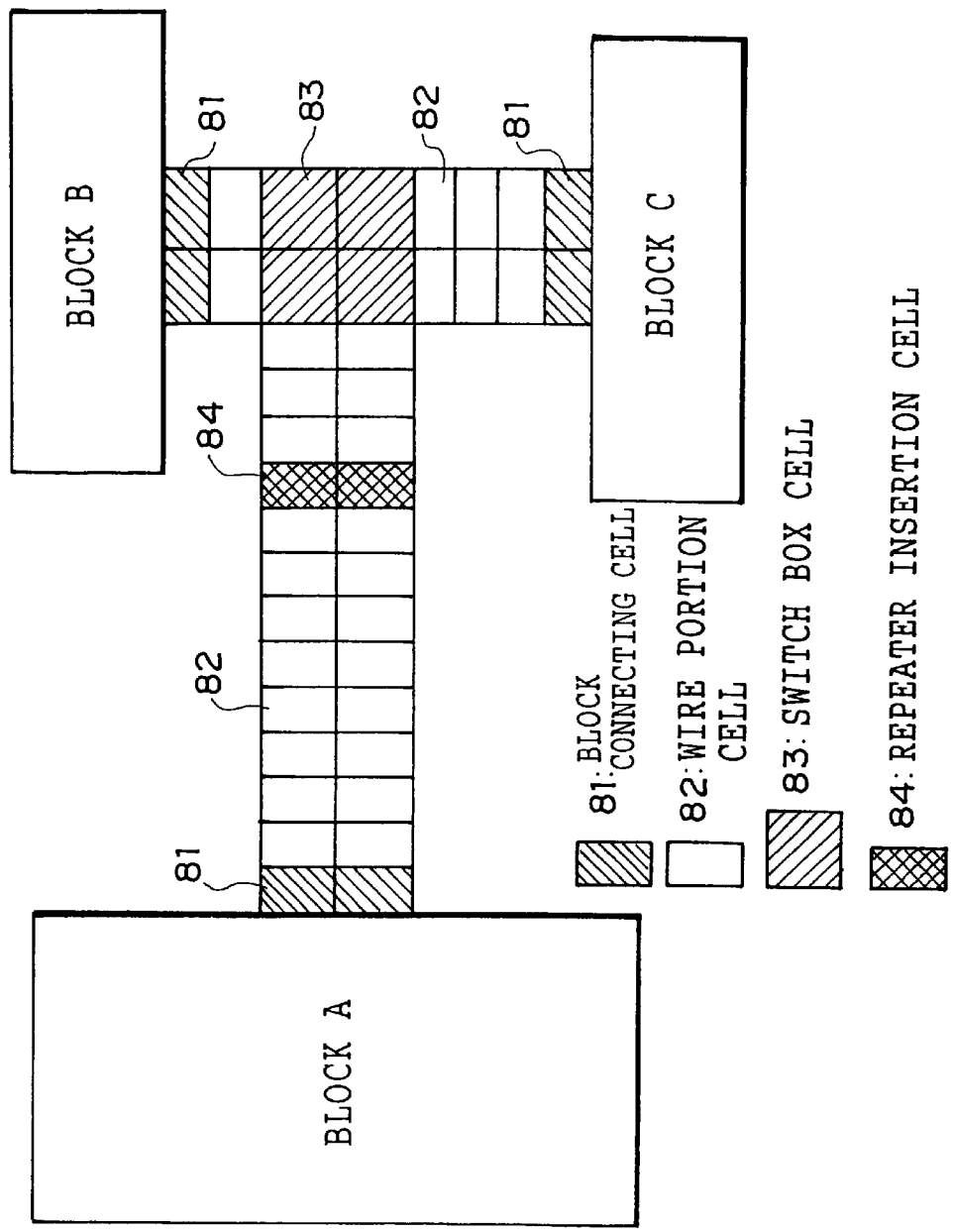
FIG. 8 is a diagram showing a layout image in a second embodiment of the present invention.

In the above-described first embodiment, a case is described in which the bus line corresponds to 8 bits. However, if an even larger number of the cells which are used exclusively for wiring of the first embodiment is used, the present invention can be applied to bus lines for 16 bits, 32 bits and 64 bits. Specifically, as shown in FIG. 8, the cells for exclusive use for wiring, such as the block connecting cells and the like in the first embodiment, may be arranged so as to be stacked longitudinally (so as to be aligned in the longitudinal direction).

Due to this structure, effects, such as a reduction in the skewing between bits, and the like can be obtained for 8-bit bus lines, 16-bit bus lines, or bus lines of even greater numbers of bits. Moreover, in LSIs having a design rule of 0.25 microns or less, crosstalk noise between bits is problematic. However, because a power source wire is inserted each 8 bits, crosstalk noise is mitigated.

(Third Embodiment)

The cells for exclusive use for wiring of the present invention can also be applied to clock lines by correcting the cells for exclusive use for wiring from use for 8 bits to use for 1 bit as shown in FIG. 9, i.e., by correcting the cells for exclusive use for wiring to include a single independent wire. In this case, there is no need to consider preventing a short circuit between adjacent wires, because only one independent wire is provided in the wire portion cell. Accordingly, in this embodiment, the wire portion cell can be used in place of the connecting portion cell that is used in the first embodiment. Hereinafter, an embodiment in which the present invention is applied to a clock line will be described. Note that description of portions which are similar to those of the first embodiment is omitted.

First, in the same way as the bus line macro of the first embodiment, macros for clock lines are formed between the respective blocks at the net list. The smaller the wire delay of the clock line, the more high speed operation of the LSI becomes possible, and thus, smaller wire delays are preferable. Accordingly, it is preferable that the number of cells which are used exclusively for wiring, which cells form the clock line macro, is kept to a minimum. The number of cells which are used exclusively for wiring is determined from the following formulas.

(number of wire portion cells for clock)=(clock period)/(wire delay of one wire portion cell for clock)     (formula 4)

(wire delay of one wire portion cell for clock)=(wire resistance)*(wire capacity)     (formula 5)

(wire delay of repeater insertion cell for clock)==(wire delay of wire cell for clock)+(self-delay of buffer)+(additional delay per 1 pF)*(wire capacity)     (formula 6)

In order to reduce clock skewing, the switch box cell is disposed at the center of the wire. Further, in order to suppress slew rate, in the same way as in the first embodiment, at least one repeater insertion cell 4 may be disposed, in place of the wire portion cell, so as to satisfy the maximum capacitance condition. FIG. 10 illustrates an example in which the repeater insertion cell is disposed adjacent to the switch box cell, i.e., an example in which the first cell exclusively used for wiring which is connected to the switch box cell is a repeater insertion cell.

In accordance with the above-described structure, clock skewing is reduced. Further, before wiring is carried out, the clock propagation delay, i.e., the clock merge at the time of synchronous design between blocks, is known.

What is claimed is:

1. A method of designing a conductive pattern layout between a plurality of blocks in an LSI, the conductive pattern transferring data from one block to the other blocks, comprising:
   (a) extracting the blocks from logic circuit data;
   (b) preparing a floor plan which defines a provisional arrangement of the blocks;
   (c) arranging a plurality of conductive pattern cells between the plurality of blocks after preparing the floor plan;
   (d) re-arranging the blocks on the basis of the arrangement of the conductive pattern cells;
   (e) arranging a plurality of power source patterns; and
   (g) arranging a plurality of signal patterns.

2. The method according to claim 1, wherein the conductive pattern cells comprise:
   a plurality of first cells having a pattern corresponding to a number of bits of data transferred from one block to the other blocks, the first cells being connected to the blocks and placed next to each block;
   a plurality of second cells having a second pattern corresponding to a number of bits of the data, the second cells being placed next to the first cells, wherein the second pattern is connected to the first pattern; and
   a plurality of third cells having third pattern corresponding to a number of bits of the data, the third pattern having a first end and a second end, wherein the first end is connected to one second pattern which extends in a first direction and the second end is connected to another second pattern which extends in a second direction.

3. The method according to claim 2, wherein the first cell and the third cell are connected by more than one second cell.

4. The method according to claim 2, wherein the first pattern comprises a first layer which is connected to the blocks, a second layer which is connected to the second pattern adjoining the first pattern and a first connection which connects the first and second layers.

5. The method according to claim 2, wherein the second pattern comprises a third layer and a fourth layer, the third layer being connected to the first end and the fourth layer being connected to the second end, the third pattern having a fifth layer provided on the same plane of the third layer, a sixth layer provided on the same plane of the fourth layer and a second connection which connects the fifth layer and sixth layers.

6. The method according to claim 2, wherein the first pattern has a plurality of patterns which are disposed substantially parallel to one another.

7. The method according to claim 2, wherein the number of bits of the data is multiples of 8.

8. The method according to claim 2, wherein the number of bits of the data is 1.

9. The method according to claim 1, further comprising:
   matching a delay of clocks in the blocks after arranging power source patterns, wherein each of the blocks comprises a plurality of cell groups.

10. The method according to claim 1, wherein a number of the conductive pattern cells which are arranged on the floor plan is determined by the following formulas:

(number of wire portion cells)=(path delay value of wires)/(wire delay of 1 wire portion cell)     (formula 1)

(wire delay of 1 wire portion cell)=(wire resistance)*(wire capacity)     (formula 2).

11. The method according to claim 10, wherein the number of the conductive pattern cells is determined such that a pattern path is as short as possible.

12. The method according to claim 1, further comprising:
   arranging a fourth cell between the blocks in place of the conductive pattern cell, so as to satisfy a maximum capacitance condition, wherein the fourth cell is connected to the first, second or third pattern.

13. The method according to claim 12, wherein the fourth cell improves slew rate.

* * * * *